United States Patent
Hanratty et al.

(10) Patent No.: US 6,930,028 B1
(45) Date of Patent: Aug. 16, 2005

(54) ANTIREFLECTIVE STRUCTURE AND METHOD

(75) Inventors: Maureen A. Hanratty, Dallas, TX (US); Daty M. Rogers, Garland, TX (US); Qizhi He, Plano, TX (US); Wei William Lee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/092,115

(22) Filed: Jun. 5, 1998

Related U.S. Application Data

(60) Provisional application No. 60/049,006, filed on Jun. 9, 1997.

(51) Int. Cl.[7] .................. H01L 21/3205; H01L 21/4763
(52) U.S. Cl. .................. 438/585; 438/769; 438/952
(58) Field of Search ................. 438/585, 769, 438/952, 669, 947, 672, 717, 595, 151, 183, 178; 430/313; 216/47; 257/192, 410

(56) References Cited

U.S. PATENT DOCUMENTS

| | | | | |
|---|---|---|---|---|
| 4,192,059 A | * | 3/1980 | Khan et al. ................. 438/287 |
| 5,059,552 A | * | 10/1991 | Harder et al. ................. 438/40 |
| 5,139,904 A | * | 8/1992 | Auda et al. | |
| 5,525,542 A | * | 6/1996 | Maniar et al. | |
| 5,674,356 A | * | 10/1997 | Nagayama ................. 438/694 |
| 5,741,736 A | * | 4/1998 | Orlowski et al. ........... 438/286 |
| 5,798,555 A | * | 8/1998 | Mishra et al. ............... 257/410 |
| 5,804,088 A | * | 9/1998 | McKee ........................ 216/47 |
| 5,837,428 A | * | 11/1998 | Huang et al. ............... 430/313 |
| 5,882,999 A | * | 3/1999 | Anderson et al. ........... 438/629 |
| 6,007,732 A | * | 12/1999 | Hashimoto et al. ........... 216/47 |
| 6,107,172 A | * | 8/2000 | Yang et al. ................. 438/585 |
| 6,127,262 A | * | 10/2000 | Huang et al. ............... 438/634 |
| 6,183,937 B1 | * | 2/2001 | Tsai et al. ................... 430/313 |
| 6,319,857 B1 | * | 11/2001 | Ibok ........................... 438/786 |
| 6,762,130 B2 | * | 7/2004 | Laaksonen et al. ......... 438/706 |

OTHER PUBLICATIONS

Wolf et al., Silicon Processing for the VLSI Era, VII, pp. 278–286, 1990.*

* cited by examiner

*Primary Examiner*—W. David Coleman
*Assistant Examiner*—Khiem Nguyen
(74) *Attorney, Agent, or Firm*—Carlton H. Hoel; W. James Brady; Frederick J. Telecky, jr.

(57) ABSTRACT

The present invention provides integrated circuit fabrication with a silicon oxynitride antireflective layer for gate location plus patterned photoresist linewidth reduction for gate length definition followed by interconnect definition without patterned photoresist linewidth reduction. This has the advantages of an antireflective layer compatible with linewidth reduction and polysilicon etching.

7 Claims, 6 Drawing Sheets

ANTIREFLECTIVE STRUCTURE AND METHOD

This application is a provisional of No. 60/049,006 filed Jun. 9, 1997.

RELATED APPLICATIONS

The following patent applications disclose related subject matter Serial No. 08/678,847, filed Jul. 12, 1996 (TI-20565). These applications have a common assignee with the present application.

BACKGROUND OF THE INVENTION

The invention relates to electronic semiconductor devices, and, more particularly, to antireflective structures and fabrication methods for such structures.

Semiconductor integrated circuits with high device density require minimal size structures such as short gates for field effect transistors, small area emitters for bipolar transistors, and narrow interconnects between devices. The formation of such polysilicon or metal (or a stack of metals or a metal silicide on polysilicon) structures typically involves definition of the locations of such structures in a layer of photoresist on a layer of polysilicon or metal by exposure of the photoresist with radiation passing through a reticle containing the desired structure pattern. During the exposure, radiation reflected from the underlying material (e.g., polysilicon, metal, . . . ) can degrade the pattern developed in the photoresist, so include an antireflective coating or layer on the polysilicon or metal. Commercial antireflective coatings include organic materials and TiN which strongly absorb at the radiation wavelength, such as polymers with dye-groups for absorption.

After exposure and development of the photoresist, the underlying layers of antireflective coating plus material (polysilicon, metal, . . . ) are anisotropically etched using the patterned photoresist as the etch mask (or the antireflective coating may first be wet developed and then the underlying material anisotropically etched). Thus the minimal structural linewidth equals the minimal linewidth that can be developed in the photoresist.

One approach to overcome the linewidth limitation patterns photoresist and then isotropically etches the patterned photoresist to shrink its size and thereby emulate a smaller original linewidth. However, this approach has a problem of the isotropic etch of the patterned photoresist also etches the antireflective coating. Ogawa et al, 2197 Proc. SPIE 722 (1994) describes the use of silicon oxynitride as an antireflective coating on a oxide coated tungsten silicide layer and on an aluminum layer for i-line and deep ultraviolet radiation by quarter-wavelength thickness for reflective interference.

SUMMARY OF THE INVENTION

The present invention provides integrated circuit fabrication with a silicon oxynitride antireflective layer for gate location plus patterned photoresist linewidth reduction for gate length definition followed by interconnect definition without patterned photoresist linewidth reduction.

This has the advantages of an antireflective layer compatible with linewidth reduction and polysilicon etching.

BRIEF DESCRIPTION OF THE DRAWINGS

The drawings are heuristic for clarity.

DESCRIPTION OF THE PREFERRED EMBODIMENTS

Overview

The preferred embodiments use a silicon oxynitride ($Si_xO_yN_z$) as an antireflective layer for patterning of photoresist on polysilicon followed by an isotropic etching of the patterned photoresist to reduce linewidth and then an anisotropic etcing of the oxynitride plus polysilicon to form gates and gate level interconnects; and lastly, overlying metal interconnects are formed using patterned photoresist without linewidth reduction but using a differing composition silicon oxynitride as antireflective layer due to the differing underlying material reflectivity.

Figure 2:
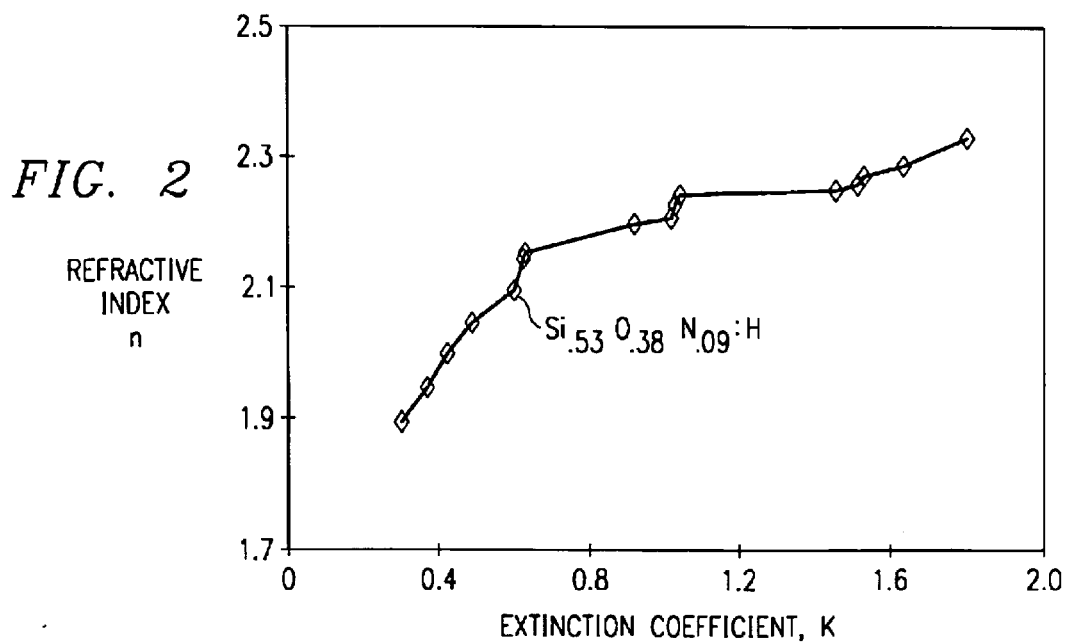
FIG. 2 illustrates the optical constant variation with composition.

The index of refraction and the extinction coefficient (real and imaginary parts of the square root of the dielectric constant) of silicon oxynitride vary with the composition (see FIG. 2). Thus, essentially select the composition to have optical constants that adjust the reflected waves amplitudes according to the underlying material reflectivity and select the oxynitride layer thickness to provide quarter-wave interference so the reflected waves cancel.

The resultant integrated circuit may include residual silicon oxynitride on the gates or interconnects or both or neither.

First Preferred Embodiment

FIGS. 1a–m illustrate in cross sectional elevation views the steps of a first preferred embodiment fabrication methods for integrated circuits including field effect transistors (e.g., CMOS or BiCMOS). The example is of lithography which has 0.25 µm minimal linewidth and a circuit with 0.25 µm minimal metal interconnect width together with 0.18 µm minimal (silicided) polysilicon linewidth (gate length). The preferred embodiment includes the following steps:

(1) Start with a silicon (or silicon on insulator) wafer 102 with LOCOS or shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit layer 104 of polysilicon gate material of thickness 300 nm; see FIG. 1a.

Figure 1A:
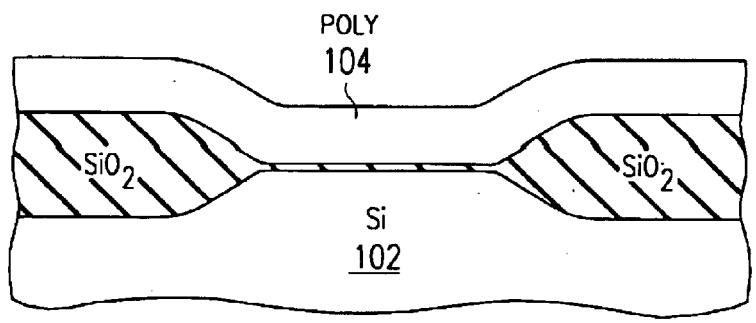
FIGS. 1a–m are cross sectional elevation views of a preferred embodiment integrated circuit fabrication method steps.
Figure 1B:
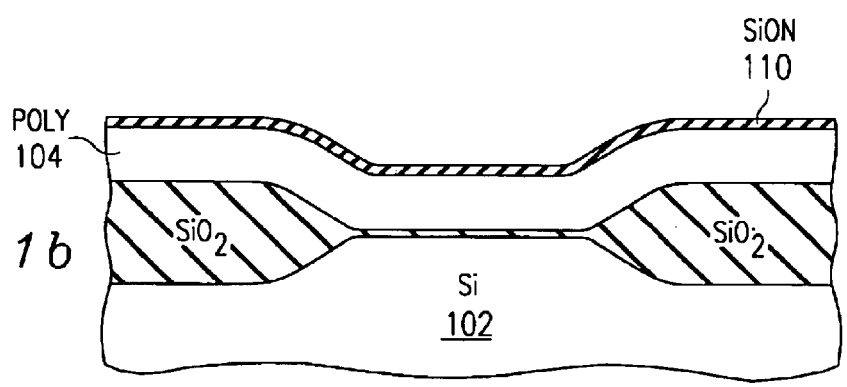

(2) Deposit a 29 nm thick conformal layer 110 of (hydrogenated) silicon oxynitride by PECVD from a flow of silane and nitrous oxide; see FIG. 1b. The composition of the oxynitride and thickness are selected according to the reflectivity of the underlying material; in particular, for polysilicon 104 take the composition to have a ratio of silicon to oxygen to nitrogen equal 53 to 38 to 9; the oxynitride also contains roughly 10% bound hydrogen, but the exact hydrogen fraction is difficult to measure. This composition gives measured optical constants of n=2.11 and k=0.55 (theoretical n=2.15 and k=0.60) and thus a layer thickness of 29 nm provides a quarter wavelength at 248 nm. See the following section on oxynitride composition.

Figure 1C:
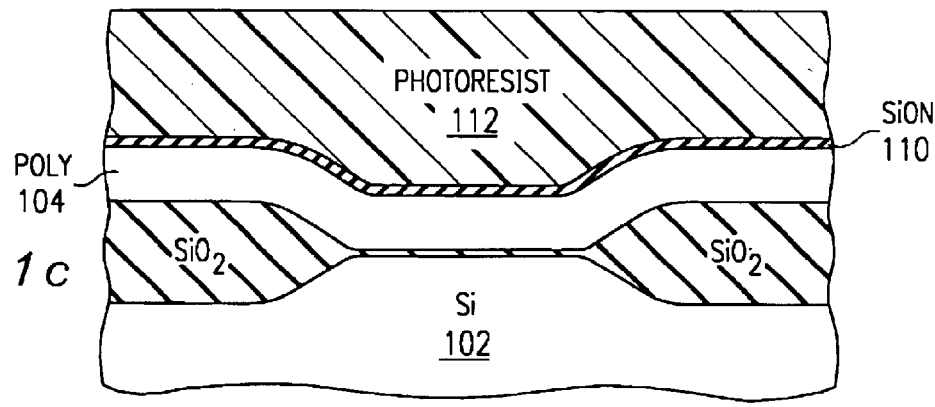
Figure 1D:
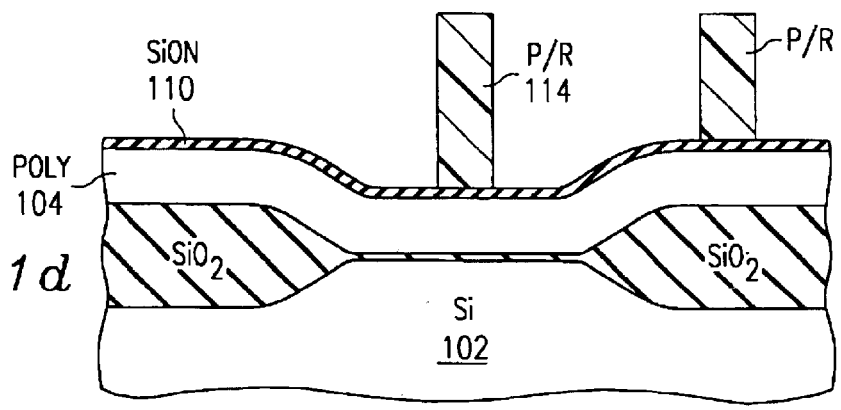
Figure 1E:
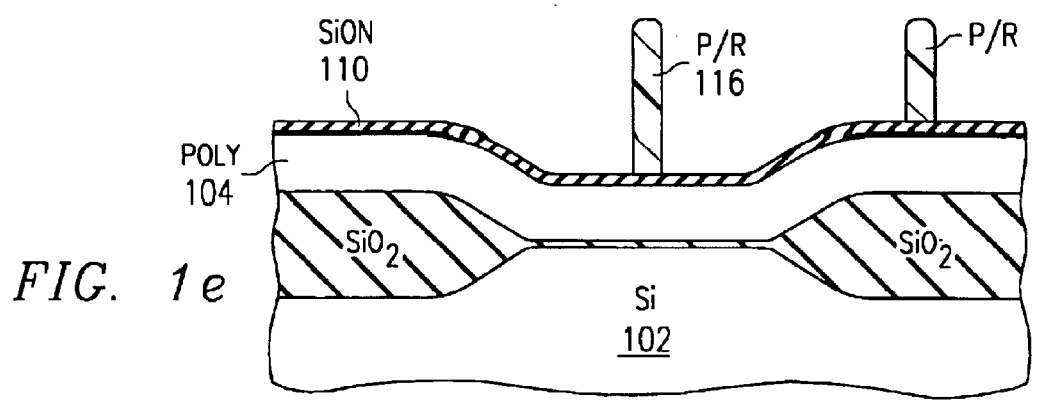
Figure 1F:
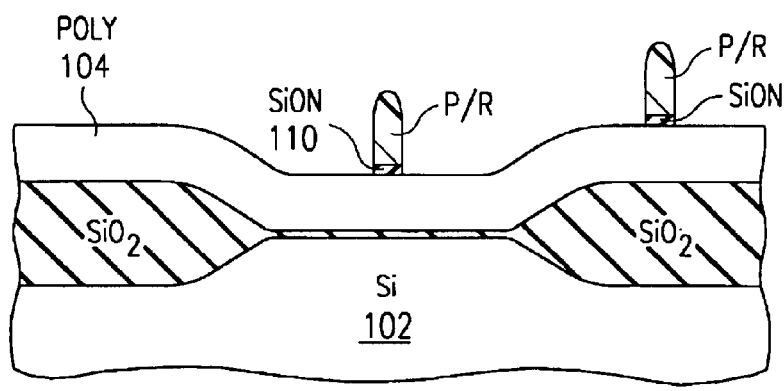

(3) Spin on 900 nm average thickness layer 112 of photoresist which is sensitive to 248 nm radiation (deep ultraviolet); see FIG. 1c.

(4) Expose photoresist 112 with 248 nm wavelength radiation through a reticle for gates and gate level interconnects; the exposed minimal linewidth may be about 250 nm. Silicon oxynitride 110 acts as an interference antireflective layerduring exposure of photoresist 112. Develop photoresist 112; see FIG. 1d which shows the differing heights of the patterned photoresist possible with LOCOS isolation.

(5) Shrink the patterned photoresist (reduce linewidth) with an isotropic etch which may be an oxygen-nitrogen plasma in a high density plasma reactor with small bias to limit ion bombardment for isotropy. The final minimal linewidth is 180 nm (although reduction to 60 nm may be achieved with good linewidth control). Thus the minimal linewidth photoresist shrinks from a 900 nm by 250 nm to roughly 850 nm by 180 nm; see FIGS. 1d–e which shows (exaggerated) original patterned photoresist line 114 reduced to photoresist line 116.

(6) Remove the exposed portion of silicon oxynitride 110 with an anisotropic plasma etch using $CF_4$ or some other fluorine source; this etch also acts as the breakthrough etch (to eliminate surface oxides) for polysilicon 104 in the next step and may be performed immediately before and in the same chamber as the polysilicon etch. This etch also reduces the photoresist height to very roughly 700 nm; see FIG. 1f.

Figure 1G:
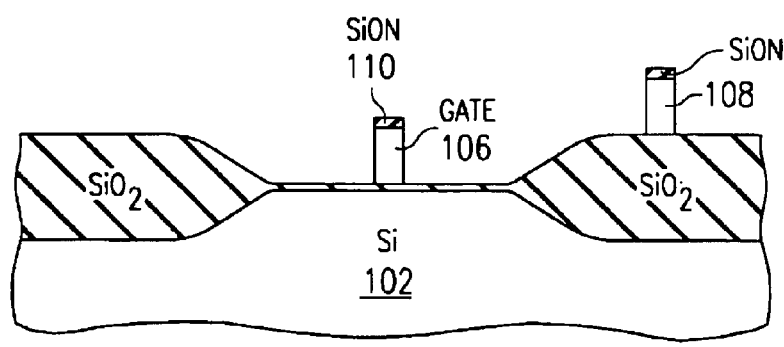
Figure 1H:
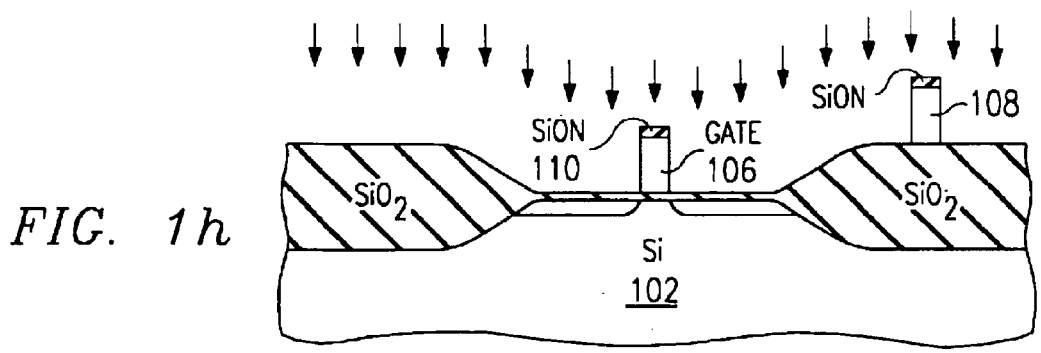
Figure 1I:
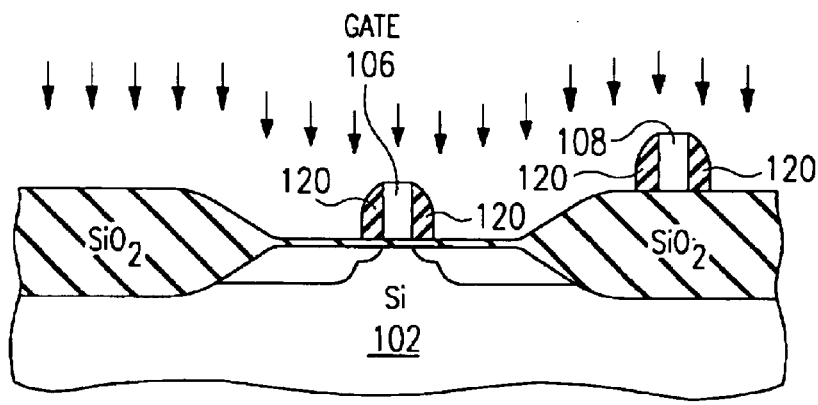

(7) Use the remaining silicon oxynitride 110 plus photoresist as an etch mask for the anisotropic plasma etch of polysilicon 104 to form gates 106 and gate level interconnects 108. The etch may be a HBr plus oxygen plasma which is very selective to oxide and oxynitride. Thus even if the polysilicon etch strips the photoresist, the oxynitride antireflective layer remains and provides sufficient etch masking because of the etch selectivity. FIG. 1g shows oxynitride-topped gates 106 plus gate level interconnects 108. The gate material could also provide a polysilicon emitter for bipolar devices which would require a prior base implant. Gates 106 are 300 nm high and 180 nm long (FIG. 1g is a cross section along the gate length, and gates typically have widths much greater than their lengths).

(8) Perform lightly doped drain implants with the gate, oxynitride, and any residual resist as the implant mask; this also requires non-critical photolithographic masking for CMOS or BiCMOS circuitry which will also remove any residual resist. See FIG. 1h.

Figure 1J:
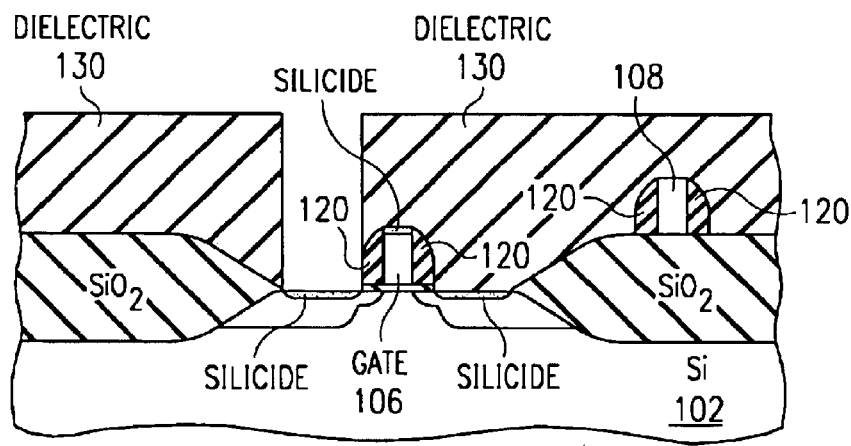

(9) Form sidewall dielectric spacers 120 on the gates (and gate level interconnects) by conformal deposition of a dielectric layer followed by anisotropic etching. The sidewall dielectric may be silicon nitride and the anisotropic etch a plasma of fluorine plus an inert gas. This sidewall spacer etch will also remove some (or all) of the oxynitride on the tops of the gates and gate level interconnects. Introduce dopants to form sources and drains; see FIG. 1i. A variation would be a self-aligned silicidation to create a silicide on both the gate top and the source/drains. This silicidation may be by stripping any remaining oxynitride from the gate tops and oxide from the source/drain surfaces, blanket metal (Ti or Co or Ni) deposition followed by reaction with underlying silicon, and then removal of unreacted metal (or TiN for the case of Ti silicidation in an nitrogen atmosphere). Figure 1j shows the resulting silicide.

(10) Form a planarized premetal dielectric layer 130 (such as reflowed BPSG or a stack of conformal and planarized layers, and the planarization may be by chemical mechanical polishing (CMP) or resist etch back). Then photolithographically define and etch vias through dielectric layer 120 for contact to the source/drains and the gate/interconnects; see FIG. 1j. The antireflective layer for this lithography may also be silicon oxynitride, but the transparency of underlying oxide makes the deeper reflections significant.

(11) For a structure with an embedded memory cell array using one-transistor one-capacitor memory cells, the bitlines and cell capacitors may be formed next. For clarity such steps are not illustrated and attendant additional dielectric layers deposited on dielectric 130 will just be considered part of dielectric 130 in the Figures.

(12). Blanket deposit (including filling vias) a metal stack such as 50 nm of Ti, 50 nm of TiN, 300 nm of W or Al (doped with Cu and Si), and 50 nm of TiN; the bottom Ti and TiN form a diffusion barrier and the top TiN forms an antireflective coating for lithography. Prior to the W or Al deposition the bottom Ti may be reacted with the source/drain to form a silicide to stabilize the metal-to-silicon contact. The Ti and TiN may be deposited by physical vapor deposition (PVD) or chemical vapor deposition (CVD) (e.g., $TiCl_4+NH_3 \rightarrow TiN+HCl$); the aluminum may be deposited by PCD and then forced into the vias under high pressure or by CVD; and W may be deposited by CVD. Alternatively the vias may be filled with W by a CVD blanket deposition followed by an etchback to leave W only in the vias, and then an Al blanket deposition.

Figure 1K:
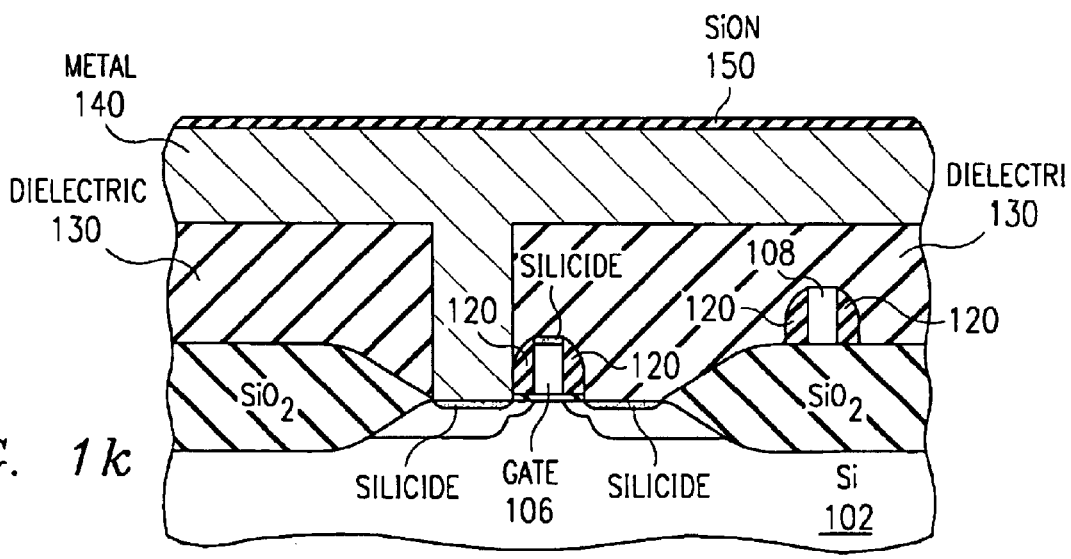

(13) Apply silicon oxynitride antireflection layer 150 on blanket metal 140; see FIG. 1k. Again, select the oxynitride composition to give optical constants according to the reflectivity of the metal and take the oxynitride layer thickness to yield a quarter-wavelength. For example, with underlying aluminum and deep ultraviolet (248 nm) exposure, take n=2.16 and k=0.83; this implies a thickness of 248 nm/4*2.16=29 nm. Note that the extinction coefficient is much larger than that of the oxynitride for the polysilicon; this is due to the greater reflectivity of the aluminum.

Figure 1L:
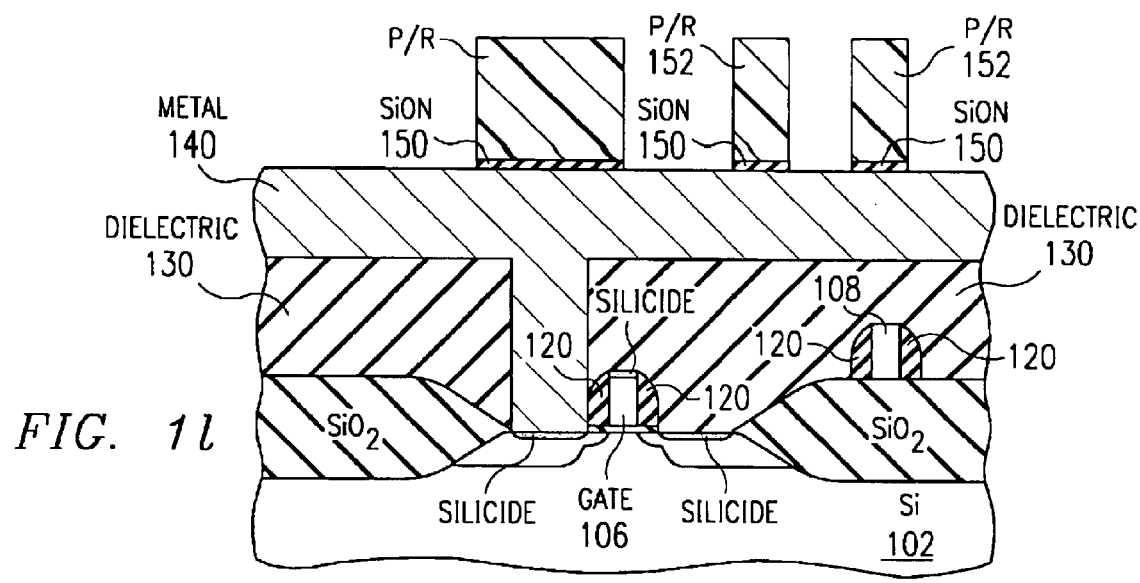
Figure 1M:
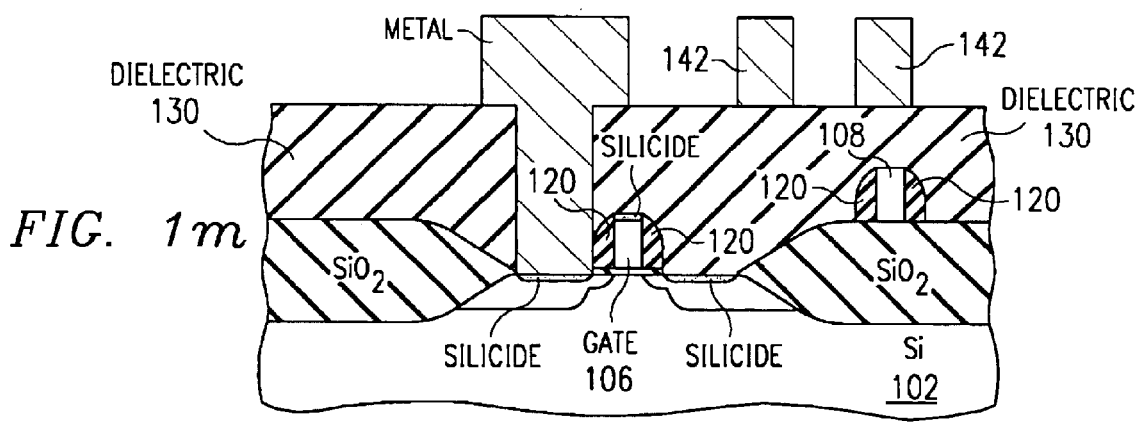

(14) Spin on photoresist and pattern it to define the first level metal interconnects; see FIG. 1l with patterned resist 152 illustrating minimal linewidth of 250 nm. Again, a brief fluorine based plasma etch strips the exposed oxynitride without removing much patterned resist. Because the interconnects are wider than the gates, no resist linewidth reduction is needed.

(15) Use the patterned resist and oxynitride as the etch mask to anisotropically plasma etch the metal and thereby form interconnects 142; chlorine-based plasmas with some fluorine for copper-doped aluminum and TiN, and fluorine-based plasmas for tungsten.

(16) Deposit a 50 nm thick conformal oxide liner 150 on interconnects 142 by plasma-enhanced decomposition of TEOS with oxygen or ozone. Liner 150 passivates the metal surfaces and prevents diffusion of metal atoms into the intermetal level dielectric, which may be a low dielectric constant material such as porous silica or fluorinated parylene. Then deposit the intermetal level dielectric over the liner-coated interconnects; the intermetal level dielectric may be a stack of two or more materials, such as porous silica between the first level interconnects and fluorinated silicon dioxide over the porous silica and interconnects.

(17) Form vias in the intermetal level dielectric analogous to the via formation of step (10). Then form second level interconnects on this intermetal level dielectric by a repetition of the foregoing steps (12)–(16). Similar repetitions may be used to form third, fourth, fifth, . . . level interconnects.

Silicon Oxynitride Composition

Silicon oxynitride has an index of refraction and extinction coefficient depending upon composition as illustrated in FIG. 2 with increasing nitrogen content increasing n and k.

Thus silicon oxynitride as an antireflective layer provides two parameters (layer thickness and composition) to adapt to the underlying material reflectivity to yield a net zero reflectivity from the antireflectivity layer. In particular, consider the simplified situation of single reflections: radiation of intensity 1 passing through the photoresist impinges on the antireflective layer and a fraction r (typically about 5–10%) reflects (with a phase shift of $\pi$) back into the photoresist and 1−r passes through the antireflective layer with attenuation by a factor $e^{-kt}$ where k is the extinction coefficient and t is the thickness of the antireflective layer. At the interface with the underlying material, a fraction R reflects (plus phase shifts by $\pi$) and the remainder transmits through and/or absorbs in the underlying material. The reflected fraction R is also attenuated by $e^{-kt}$ as it passes back through the antireflective layer and reenters the photoresist. Thus the portion reflected from the underlying material is $R(1-r)e^{-2kt}$ and this is to cancel the initially reflected portion r. To cancel, the amplitudes must equal ($r=R(1-r)e^{-2kt}$) and the phases must differ by 7 which implies the thickness t must be a quarter wavelength. The wavelength in antireflective layer is the radiation's in vacuo wavelength $\lambda$ divided by the index of refraction n of the antireflective layer. Thus take $t=\lambda/4n$, and select the composition of the oxynitride to have the ratio k/n satisfying:

$$r=R(1-r)e^{-k\lambda/4n}$$

$$k/n=4/\lambda[\log(R)+\log((1-r)/r)]$$

Of course, the reflectivity r depends upon n and k and the optical constants of the photoresist, but is relatively constant over a range n and k. Similarly, once the underlying material is known, R is approximately known (it also depends upon n and k), and the composition to give the desired k/n can be selected.

Figure 3:
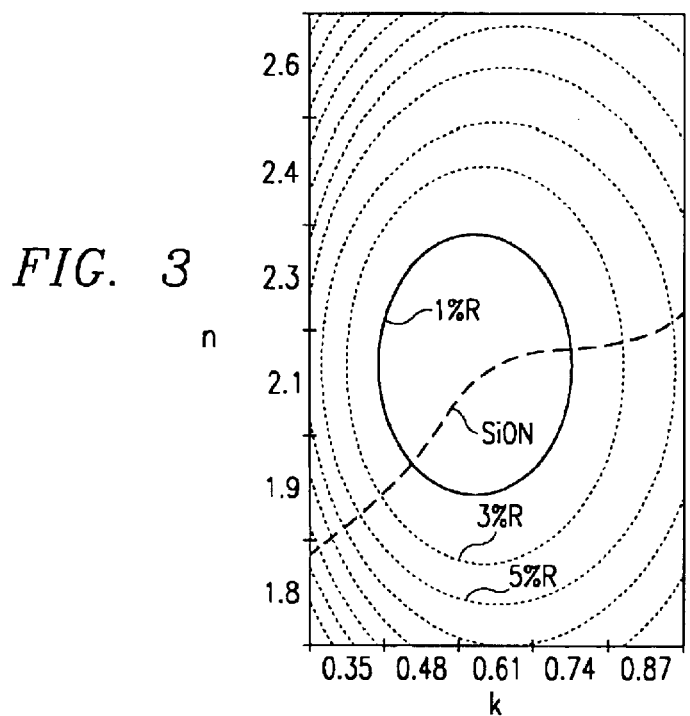
FIG. 3 shows net reflection.

FIG. 3 shows the computed net reflection back into resist as a function of the optical constants of the oxynitride with more precise modeling of reflections at the interfaces of resist-oxynitride and oxynitride-polysilicon for an oxynitride layer thickness of 29 nm. Inside the central contour shows the less than 1% net reflection into the resist. Also, FIG. 3 shows the n-k relation curve of silicon oxynitride as in FIG. 2 superimposed on the computed net reflections; the curve passes through the center of the region of less than 1% net reflection which indicates that targeting the composition at the center will give robust oxynitride parameters.

Linewidth Reduction

Figure 4:
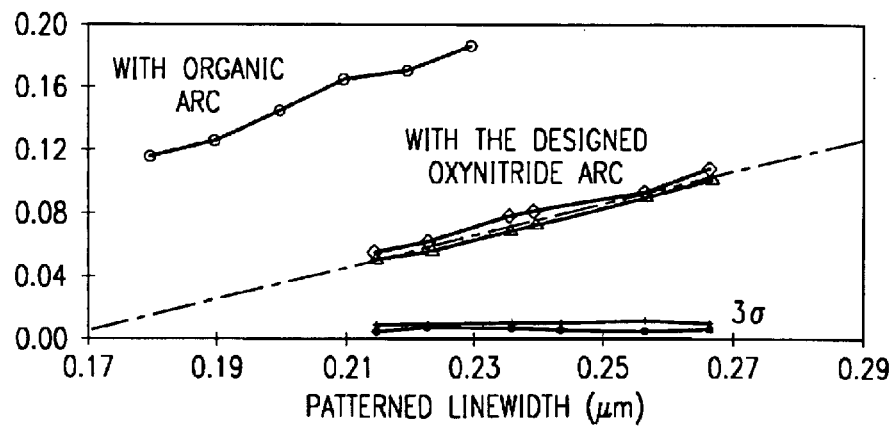
FIG. 4 illustrates linewidth reduction.

FIG. 4 shows the robustness of the patterned resist linewidth reduction using oxynitride antireflective layer with a fixed oxygen resist etch (which removes 80 nm of resist) for various initial resist linewidths. FIG. 4 indicates the standard deviation observed in the reduced linewidth by the three sigma curves in FIG. 4. Thus a reduction from 220 nm to 60 nm has a standard deviation of roughly 2–3 nm. This robust large linewidth reduction using the silicon oxynitride antireflective layer permits the original resist linewidth to be patterned in a range where the lithography is well controlled.

Disposable Gate Preferred Embodiment

FIGS. 5a–d illustrate a disposable gate method of integrated circuit fabrication which uses the silicon oxynitride antireflective layer. In particular, follow the foregoing steps (1)–(9) to have a polysilicon dummy gate with sidewall spacers and source/drains formed in the substrate. Use the patterned resist reduction to make the dummy gate length only 60 nm; this can be achieved by an original dummy gate length of 220 nm followed by 80 nm resist etch (see FIG. 4). The resulting structure is analogous to that of FIG. 1i.

Figure 5A:
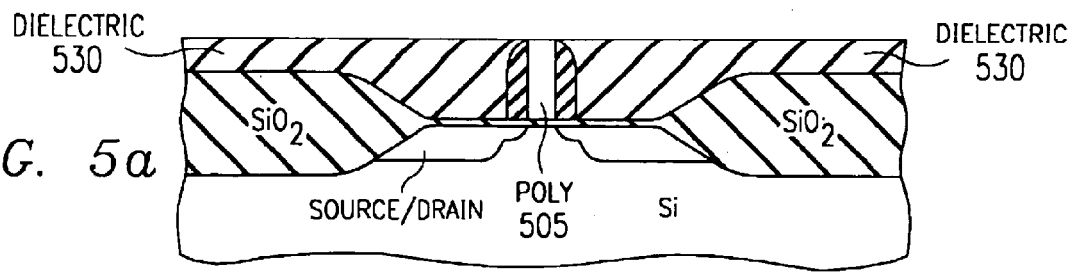
FIGS. 5a–d are cross sectional elevation views of another preferred embodiment.

Deposit 500 nm thick dielectric, such as TEOS oxide, and planarize, such as by CMP, to expose the top of the polysilicon dummy gate. FIG. 5a shows dummy gate 505 and dielectric 530; dummy gate 505 may be about 200 nm high and 60 nm long.

Figure 5B:
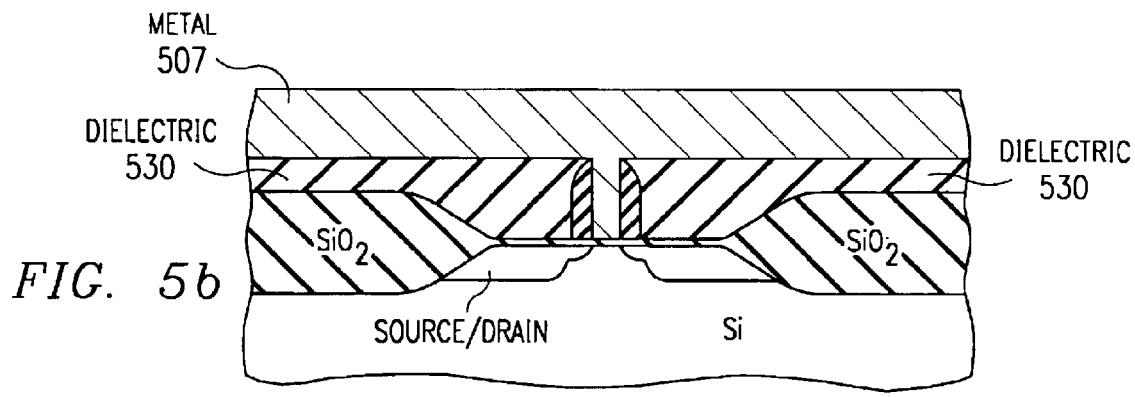
Figure 5C:
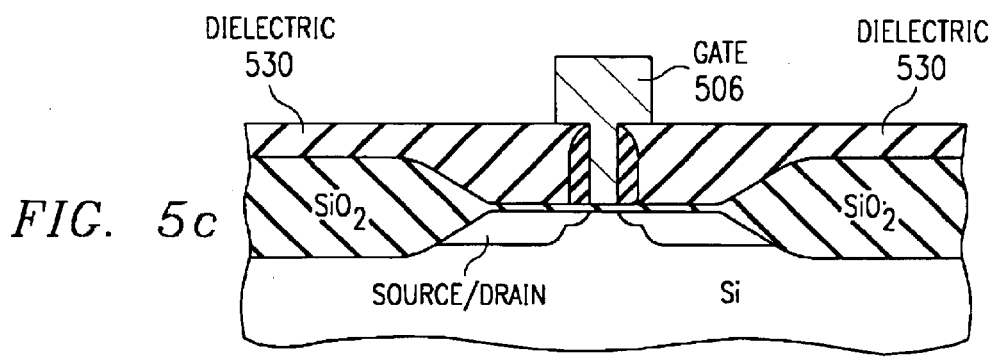
Figure 5D:
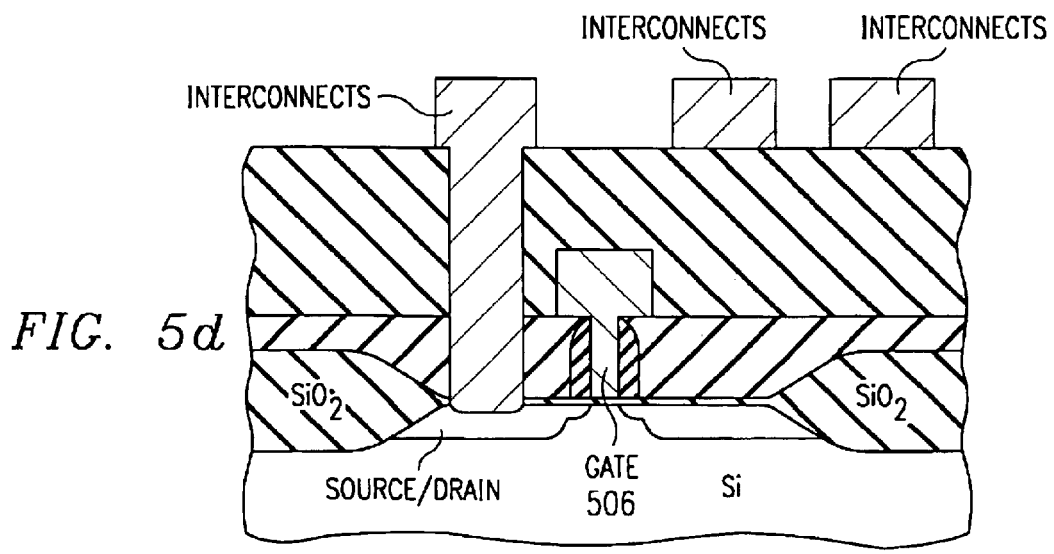

Etch out dummy gate 505 with an HBr+O2 plasma. Optionally, strip the gate oxide and thermally grow a new gate oxide at the bottom of the groove left by the removal of dummy gate 505. Next, blanket deposit gate material, such as TiN or a stack of different metals, to fill the groove plus cover dielectric 530; see FIG. 5b showing 200 nm thick metal gate material 507.

Deposited 29 nm thick silicon oxynitride with composition (optical constants) adapted to the gate material, followed by spin on of photoresist sensitive to 248 nm radiation. Pattern the photoresist to define a gate top of length 250 nm, and use the patterned photoresist (without linewidth reduction) to etch gate material 507 to form T-shaped gate 506; see FIG. 5c.

Continue as in foregoing step (10)–(17) by dielectric deposition, via formation, first level metal interconnect formation, and so forth. See FIG. 5d.

Damascene Preferred Embodiment

Figure 6:
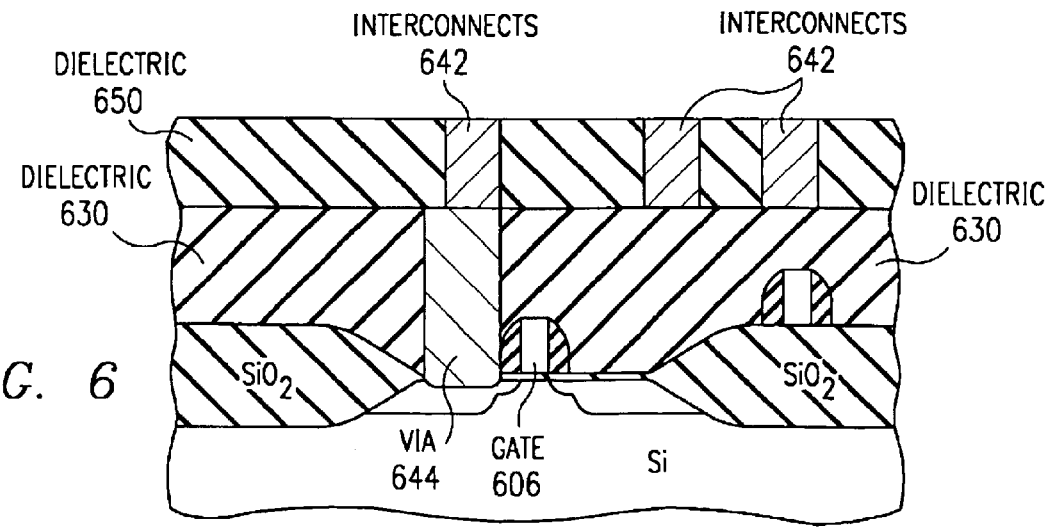
FIG. 6 shows a damascene preferred embodiment.

The metal interconnect structure of the foregoing preferred embodiments can be replaced with a damascene interconnect structure because the photoresist linewidth reduction is only used in the gate level. In particular, repeat the foregoing steps (1)–(12) with the variation in step (12) of first fill the vias, then deposit a second dielectric level, photolithographically define locations for grooves in the dielectric, next etch the dielectric to form the grooves, and then blanket metal with CMP or etchback to leave metal only in the grooves and thereby form the interconnects. FIG. 6 illustrates the damascene structure for one metal level with gate 606, premetal level dielectric 630, filled via 644, and first metal level dielectric 650.

Modifications

The preferred embodiments can be modified in various ways while retaining the features of silicon oxynitride antireflective layer for resist linewidth reduction and linewidth reduction for gates together with no linewidth reduction for interconnects.

For example, the photoresist may be exposed at different radiation wavelengths, such as 193 nm, with corresponding adjustment in antireflective layer thickness.

What is claimed is:

1. A method of fabrication of an integrated circuit, comprising the steps of:
   (a) patterning a first layer of resist on a layer of antireflective coating comprising a silicon oxynitride material and which is on a layer of gate material to define gate locations;
   (b) reducing the linewidth of said patterned layer of resist of step (a);
   (c) using said reduced linewidth patterned resist as an etch mask to form gates from said layer of gate material;
   (d) forming a layer of dielectric on said gates;
   (e) patterning a second layer of photoresist on a second layer of antireflective coating comprising a second silicon oxynitride material to define interconnects;
   (f) using said patterned photoresist without linewidth reduction to form interconnects over said gates.

2. The method of claim 1, wherein:
   (a) said using of step (f) of claim 1 is using the patterned photoresist as an etch mask for an underlying layer of metal.

3. The method of claim 1, wherein:
(a) said using of step (f) of claim 1 is using the patterned photoresist as an etch mask to etch grooves in underlying dielectric to be filled with metal.

4. A method of fabrication of an integrated circuit gate, comprising the steps of:
(a) patterning a first layer of resist on an antireflective layer of a first silicon oxynitride material on a layer of dummy gate material to define gate locations;
(b) reducing the linewidth of said patterned layer of resist of step (a);
(c) using said reduced linewidth patterned resist as an etch mask to form dummy gates from said layer of dummy gate material;
(d) forming a layer of dielectric adjacent said dummy gates;
(e) removing said dummy gates;
(f) depositing gate material on said dielectric and
(g) patterning a second layer of photoresist on a second antireflective layer of a second silicon oxynitride material on said gate material to define gates;
(h) using said patterned photoresist without linewidth reduction to form gates.

5. A method of fabrication of an integrated circuit, comprising the steps of:
(a) patterning a first layer of resist on a first layer of anti reflective coating comprising a first silicon oxynitride material and which is on a layer of gate material to define gate locations;
(b) using said patterned resist of step (a) as an etch mask to form gates from said layer of gate material;
(c) forming a layer of dielectric on said gates;
(d) patterning a second layer of resist on a second layer of antireflective coating comprising a second silicon oxynitride material to define interconnects;
(e) using said patterned resist of step (d) to form interconnects over said gates.

6. The method of claim 5, wherein:
(a) said using of step (e) of claim 5 is using the patterned resist as an etch mask for an underlying layer of metal.

7. The method of claim 5, wherein:
(a) said using of step (e) of claim 5 is using the patterned resist as an etch mask to etch grooves in underlying dielectric to be filled with metal.

* * * * *